United States Patent
Lee et al.

(10) Patent No.: US 8,869,863 B2
(45) Date of Patent: Oct. 28, 2014

(54) DELAMINATION APPARATUS AND INLINE THERMAL IMAGING SYSTEM

(75) Inventors: Byung-Chul Lee, Yongin (KR); Jae-Seok Park, Yongin (KR); Jae-Ha Lim, Yongin (KR); Jin-Han Park, Yongin (KR); Dong-Sul Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 23 days.

(21) Appl. No.: 13/486,875

(22) Filed: Jun. 1, 2012

(65) Prior Publication Data
US 2013/0133835 A1    May 30, 2013

(30) Foreign Application Priority Data
Nov. 29, 2011    (KR) .................. 10-2011-0126314

(51) Int. Cl.
*B32B 38/10*    (2006.01)

(52) U.S. Cl.
USPC .......................................... 156/760; 156/716

(58) Field of Classification Search
None
See application file for complete search history.

(56) References Cited

U.S. PATENT DOCUMENTS

| | | | |
|---|---|---|---|
| 5,169,474 A * | 12/1992 | Binder ........................ | 156/715 |
| 5,520,776 A * | 5/1996 | Van Allen et al. ............. | 156/759 |
| 6,231,253 B1 * | 5/2001 | Henderson et al. ........... | 400/618 |
| 6,595,261 B2 * | 7/2003 | Fitterer ........................ | 156/763 |
| 6,681,828 B1 * | 1/2004 | Clough et al. ................. | 156/767 |
| 7,846,289 B2 * | 12/2010 | Tsujimoto et al. ............. | 156/247 |
| 8,029,642 B2 * | 10/2011 | Hagman ....................... | 156/715 |
| 8,052,835 B2 * | 11/2011 | Merrill et al. ................. | 156/707 |
| 8,110,069 B2 * | 2/2012 | Garben ........................ | 156/715 |
| 8,171,977 B2 * | 5/2012 | Kobayashi .................... | 156/760 |
| 8,182,632 B2 * | 5/2012 | Kino et al. .................... | 156/247 |
| 8,408,270 B2 * | 4/2013 | Barton et al. ................. | 156/757 |
| 2004/0239827 A1 | 12/2004 | Yamazaki et al. | |

FOREIGN PATENT DOCUMENTS

| | | |
|---|---|---|
| JP | 2005-35097 | 2/2005 |
| KR | 10-2011-0050658 | 5/2011 |
| KR | 10-2011-0087830 | 8/2011 |

* cited by examiner

*Primary Examiner* — Philip Tucker
*Assistant Examiner* — Nickolas Harm
(74) *Attorney, Agent, or Firm* — Robert E. Bushnell, Esq.

(57) ABSTRACT

A delamination apparatus includes a stage, a first roll unit, a gripper, and a second roll unit. The stage includes a peripheral area and a substrate area. An edge of a donor film is attached at the peripheral area. An acceptor substrate, laminated at on the donor film, is disposed at the substrate area. The first roll unit is disposed on the donor film, moves in a lengthwise direction of the acceptor substrate. The gripper is disposed on the donor film, and is configured to separate the edge of the donor film from the stage so as to cause the donor film to contact the first roll unit. The second roll unit is disposed on the stage, contacts the donor film which contacts the first roll unit, and delaminates the donor film from the acceptor substrate by moving in the lengthwise direction with the first roll unit.

9 Claims, 10 Drawing Sheets

DELAMINATION APPARATUS AND INLINE THERMAL IMAGING SYSTEM

CLAIM OF PRIORITY

This application makes reference to, incorporates the same herein, and claims all benefits accruing under 35 U.S.C. §119 from an application earlier filed in the Korean Intellectual Property Office on 29 Nov. 2011 and there duly assigned Serial No. 10-2011-0126314.

BACKGROUND OF THE INVENTION

1. Field of the Invention

The present invention relates generally to a delamination apparatus and an inline thermal imaging system including the same. More particularly, the invention relates to a delamination apparatus for forming an organic layer of an organic light emitting diode (OLED) display and an inline thermal imaging system including the same.

2. Description of the Related Art

An organic light emitting element is a flat display device. Such an organic light emitting element may include an anode, a cathode, and at least an organic emission layer interleaved between the anode and the cathode. The organic light emitting element has the advantages of a wide viewing angle and a superior contract as well as a fast response speed. Due to the merits of the organic light emitting element, the organic light emitting element has been receiving attention as the next generation display element.

The organic light emitting element may further include at least one of organic layers interleaved among a hole injection layer (HIL), a hole transport layer (ETL), and an electron injection layer (EIL) according to whether an emission layer is made of a high molecular organic material or a low molecular organic material besides an organic emission layer.

In such an organic light emitting element, an organic layer is required to be patterned in order to realize full color. A low molecular organic light emitting element may be patterned using a shadow mask, and a high molecular organic light emitting element may be patterned through an ink-jet printing method and a laser induced thermal imaging (LITI) method using laser. The LITI method has merits. For example, the LITI method can pattern a large area of an organic layer. Furthermore, the LITI method can pattern an organic layer with high precision and with high resolution.

The above information disclosed in this Background section is only for enhancement of an understanding of the background of the described technology and therefore it may contain information that does not form the prior art which is already known in this country to a person of ordinary skill in the art.

SUMMARY OF THE INVENTION

The described technology has been developed in an effort to provide a delamination apparatus and an inline thermal imaging system having the same, which have the advantages of minimizing defects generated during a delamination process used in a thermal imaging method.

An exemplary embodiment of the invention provides a delamination apparatus. The delamination apparatus may include a stage, a first roll unit, a gripper, and a second roll unit. The stage may include a peripheral area and a substrate area. An edge of a donor film may be attached at the peripheral area. An acceptor substrate laminated at a center part of the donor film may be disposed at the substrate area. The first roll unit may be disposed on the donor film corresponding to the substrate area, and may be configured to move in a lengthwise direction of the acceptor substrate. The gripper may be disposed on the donor film corresponding to the peripheral area, and may be configured to separate the edge of the donor film from the stage to make the donor film contact the first roll unit. The second roll unit may be disposed on the stage so as to be adjacent to the first roll unit, may contact the donor film with the donor film contacting the first roll unit interposed, and may be configured to delaminate the donor film from the acceptor substrate by moving in the lengthwise direction with the first roll unit.

The acceptor substrate may include an align key, and the stage may further include a backlight unit corresponding to the align key.

The first roll unit may include a main roll and a pressurizing roll. The main roll may be disposed on the donor film in correspondence to the substrate area and may contact the donor film. The pressurizing roll may extend in a direction from the main roll to the stage, and may be configured to pressurize the donor film corresponding to the peripheral area.

The second roll unit may include a supplemental roll, a peeling tip, and a cutter. The supplemental roll may be adjacent to the main roll and may contact the donor film. The peeling tip may extend in a direction from the supplemental roll to the stage corresponding to the pressurizing roll and may be inserted between the donor film corresponding to the peripheral area and the stage. The cutter may be disposed at an outer side of the peeling tip and may be configured to cut the donor film.

The peeling tip may include an inhaling member. The inhaling member may be configured to inhale air between the donor film and the stage.

The stage may further include a concavity unit disposed at the peripheral area corresponding to the cutter. A part of the cutter may be inserted into the concavity unit.

The stage may further include an exhaling member connected to the concavity unit and configured to inhale air of the concavity unit.

A bottom film may be disposed between the stage and the acceptor substrate and between the stage and the donor film corresponding to the peripheral area and the substrate area.

Another exemplary embodiment of the invention provides an inline thermal imaging system. The inline thermal imaging system may include the above described delamination apparatus, a transport apparatus, a lamination apparatus, and a stage conveying apparatus. The transport apparatus may be adjacent to the delamination apparatus and may include a laser unit for radiating laser to the donor film corresponding to the substrate area of the stage. The lamination apparatus may be adjacent to the transport apparatus and may include a lamination unit for laminating the donor film at the stage and the acceptor substrate. The stage conveying apparatus may convey the stage to the lamination apparatus, the transport apparatus, and the lamination apparatus, respectively.

In accordance with exemplary embodiments of the invention, a delamination apparatus and an inline thermal imaging system having the same may minimize a defect generated during a delamination process using a thermal imaging method.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
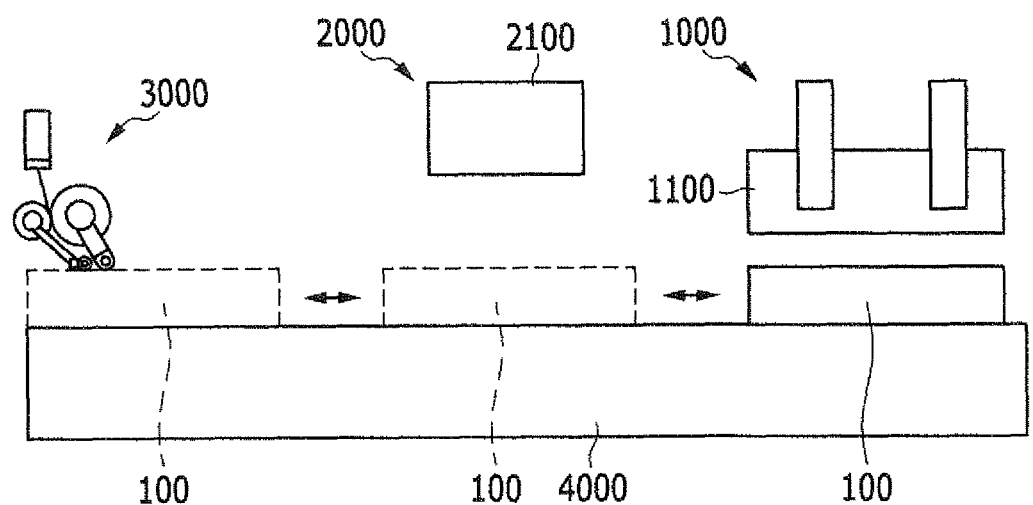
FIG. 1 illustrates an inline thermal imaging system in accordance with a first exemplary embodiment of the invention.

In the following detailed description, only certain exemplary embodiments have been shown and described, simply by way of illustration. As those skilled in the art will realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

For various exemplary embodiments, constituent elements having the same constitution are designated by the same reference numerals and explained representatively in the first exemplary embodiment. In the other exemplary embodiments, only the constituent elements different from those in the first exemplary embodiment are described.

In the drawings, the size and thickness of each element is approximately shown for better understanding and ease of description. Therefore, the present invention is not limited to the drawings.

In the drawings, the thicknesses of layers, films, panels, regions, etc., are exaggerated for clarity. In the drawings, a size and a thickness of each element are exaggerated for better understanding and ease of description. It will be understood that, when an element such as a layer, film, region, or substrate is referred to as being "on" another element, it can be directly on the other element or intervening elements may also be present.

In addition, unless explicitly described to the contrary, the word "comprise", and variations such as "comprises" or "comprising", will be understood to imply the inclusion of stated elements but not the exclusion of any other elements. It will be understood that, when an element such as a layer, file, region, or substrate is referred to as being "on" another element, it can be on the other element or under the other element. The element may not be on another element in a gravitational direction.

Hereinafter, an inline thermal imaging system in accordance with a first exemplary embodiment of the invention will be described with reference to FIG. 1.

FIG. 1 illustrates an inline thermal imaging system in accordance with a first exemplary embodiment of the invention.

As shown in FIG. 1, the inline thermal imaging system according to the first exemplary embodiment may laminate a donor film at an acceptor substrate, form an organic layer on the donor film by radiating laser to the donor film, transport the organic layer from the donor film to the acceptor substrate, and delaminate the donor film from the acceptor substrate. The inline thermal imaging system may include a lamination apparatus 1000, a transport apparatus 2000, a delamination apparatus 3000, and a stage conveying apparatus 4000. The stage conveying apparatus 4000 may convey a stage 100, on which the acceptor substrate is placed, to the lamination apparatus 1000, the transport apparatus 2000, and the delamination apparatus 3000, respectively. The stage conveying apparatus 4000 may include a conveying unit, such as a rail and a motor for driving the transfer unit. The stage 100 conveyed by the stage convey apparatus 4000 may be included in the lamination apparatus 1000, the transport apparatus 2000, and the delamination apparatus 3000, respectively.

Figure 2:
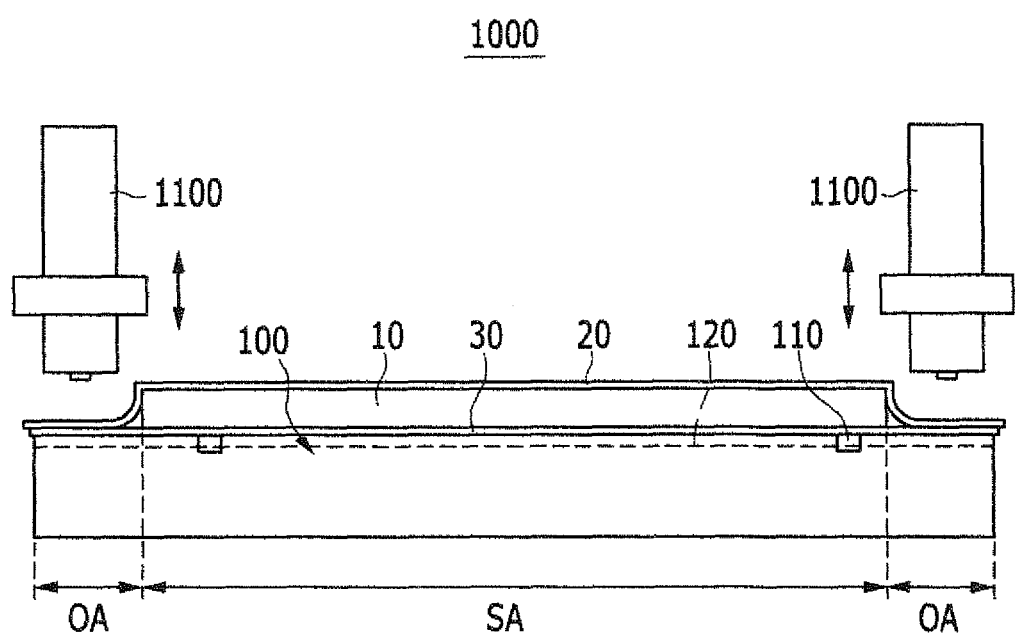
FIG. 2 illustrates a lamination apparatus of FIG. 1.

FIG. 2 illustrates a lamination apparatus of FIG. 1.

As shown in FIG. 2, the lamination apparatus 1000 may laminate a donor film 20 on an acceptor substrate 10. The lamination apparatus 1000 may include a stage 100 and a lamination unit 1100.

The stage 100 may include a peripheral area (OA), a substrate area (SA), a back light unit 110, and a concavity unit 120. An edge of the donor film 20 may be attached to the peripheral area (OA), and the acceptor substrate 10 is placed on the substrate area (SA). The acceptor substrate 10 may be laminated at a center area of the donor film 20. The backlight unit 110 may be disposed in correspondence to the substrate area (SA) and may correspond to an align key formed at the acceptor substrate 10. The concavity unit 120 may be disposed in correspondence to the peripheral area (OA) and may be formed so as to be sunken.

The lamination unit 1100 may be movable in a top-to-bottom direction with respect to the stage 100. The lamination unit 1100 may maintain a vacuum state at an area where the acceptor substrate 10 is disposed and may laminate a donor film 20 and a bottom film 30 corresponding to the peripheral area (OA) of the stage 100 using heat. Accordingly, the donor film 20 may be laminated on the acceptor substrate 10, and the acceptor substrate 10 may be sealed between the donor film 20 and the bottom film 30. The bottom film 30 may be disposed between the stage 100 and the acceptor substrate 10, and between the stage 100 and the donor film 20, corresponding to the peripheral area (OA) and the substrate area (SA).

As described above, the bottom film 30 may be disposed between the stage 100 and the acceptor substrate 10, and between the stage 100 and the donor film 20, in the first exemplary embodiment. However, the present invention is not limited thereto. For example, a donor film 20 corresponding to the peripheral area (OA) of the stage 100 may be directly attached to the stage 100 without the bottom film 30 in accordance with another exemplary embodiment.

Hereinafter, the acceptor substrate 10 with the donor film 20 laminated will be described.

Figure 3:
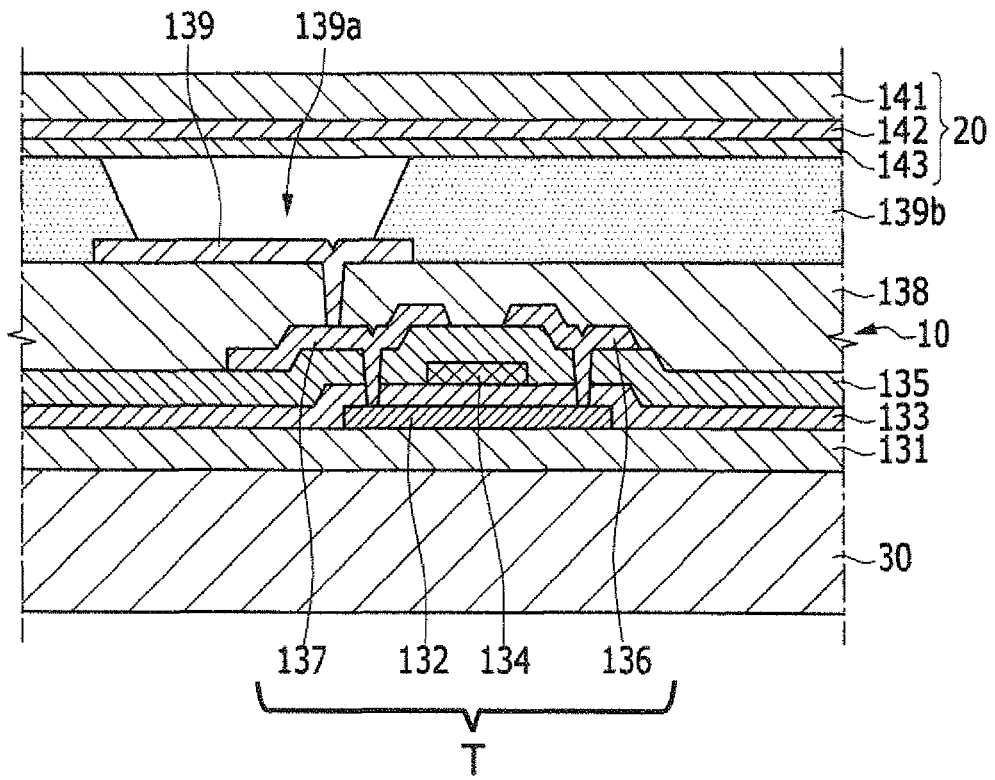
FIG. 3 is a cross-sectional view illustrating an acceptor substrate laminated with a donor film using a lamination apparatus of FIG. 2.

FIG. 3 is a cross-sectional view illustrating an acceptor substrate laminated with a donor film using a lamination apparatus of FIG. 2.

As shown in FIG. 3, the acceptor substrate 10 may be disposed on a semiconductor layer 132 formed on a predetermined area of the substrate 131. The semiconductor layer 132 may be an amorphous silicon layer or a polysilicon layer. The polysilicon layer may be formed by crystallizing an amorphous silicon layer. A gate insulating layer 133 may be disposed on the semiconductor layer 132. The gate insulating layer 133 may be a first insulating layer. A gate electrode 134 may be disposed on the gate insulating layer 133 and the gate electrode 134 may be overlapped with the semiconductor layer 132. A second insulating layer 135 may be disposed on the gate electrode 134. The second insulating layer 135 may cover the semiconductor layer 132 and the gate electrode 134. A source electrode 136 and a drain electrode 137 may be disposed on the second insulating layer 135. The source electrode 136 and the drain electrode 137 may penetrate the second insulating 135 and the first insulating layer 133 and contact both ends of the semiconductor layer 132. The semiconductor layer 132, the gate electrode 134, and the source/drain electrodes 136 and 137, respectively, may form a thin film transistor (T). A third insulating layer 138 may be disposed on the source/drain electrodes 136 and 137, respectively. The third insulating layer 138 may cover the source/drain electrodes 136 and 137, respectively. The third insulating layer 138 may be a planarization layer to alleviate a step difference between a passivation layer and/or the thin film transistor (T). The passivation layer may protect the thin film transistor (T). A pixel electrode 139 may be disposed on the third insulating layer 138. The pixel electrode 139 may penetrate the third insulating layer 138 and contact the drain electrode 137. For example, the pixel electrode 139 may be an Indium Tin Oxide (ITO) layer or an Indium Zinc Oxide (IZO) layer. A pixel defining layer 139b may be disposed on the pixel electrode 139. The pixel defining layer 139b may expose a part of the pixel electrode 139.

The donor film 20 laminated on the acceptor substrate 10 may include a base film 141, a light to heat conversion layer 142, and an organic layer 143. The light to heat conversion layer 142 and the organic layer 143 may be sequentially stacked on one side of the base film 141. The donor film 20 may have a predetermined elasticity. The based film 141 may be made of a transparent high molecular organic material such as polyethylene terephthalate (PET), polyethylene naphthalate (PEN), polyethylene (PE), and plycarbonate (PC). The light to heat conversion layer 142 may convert an incident light, which is laser, to heat. The light to heat conversion layer 142 may include light absorption material such as aluminum oxide, aluminum sulfide, carbon black, graphite or infrared ray dye. The organic layer 143 may be at least one selected from the group consisting of a hole injection layer (HIL), a hole transport layer (HTL), an electro-luminescence layer, a hole suppress layer, an electron transport layer (ETL), and an electron injection layer (EIL).

Figure 4:
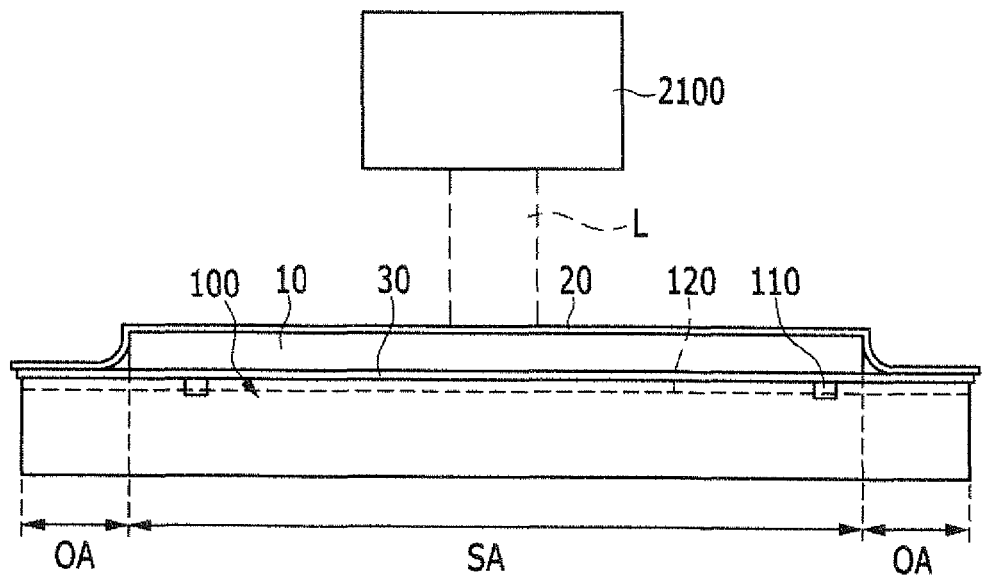
FIG. 4 illustrates a transport apparatus of FIG. 1.

FIG. 4 illustrates a transport apparatus of FIG. 1.

As shown in FIG. 1, the transport apparatus 2000 may be disposed between the lamination apparatus 1000 and the delamination apparatus 3000. As shown in FIG. 4, the transport apparatus 2000 may transport an organic layer of the donor film 20, laminated at the acceptor substrate 10, onto the acceptor substrate 10. The transport apparatus 2000 may include a stage 100 and a laser unit 2100.

The laser unit 2100 may radiate laser (L) at the donor film 20 corresponding to a substrate area (SA) of the stage 100. Due to the laser (L), the organic layer 143 (FIG. 3) formed on the donor film 20 (FIG. 4) may be transported to the acceptor substrate 10. The laser (L) may be radiated onto the donor film 20 in correspondence to an opening 139a (FIG. 3) of the acceptor substrate 10.

Hereinafter, the acceptor substrate 10, to which the organic layer 143 of the donor film 20 is transferred, will be described.

Figure 5:
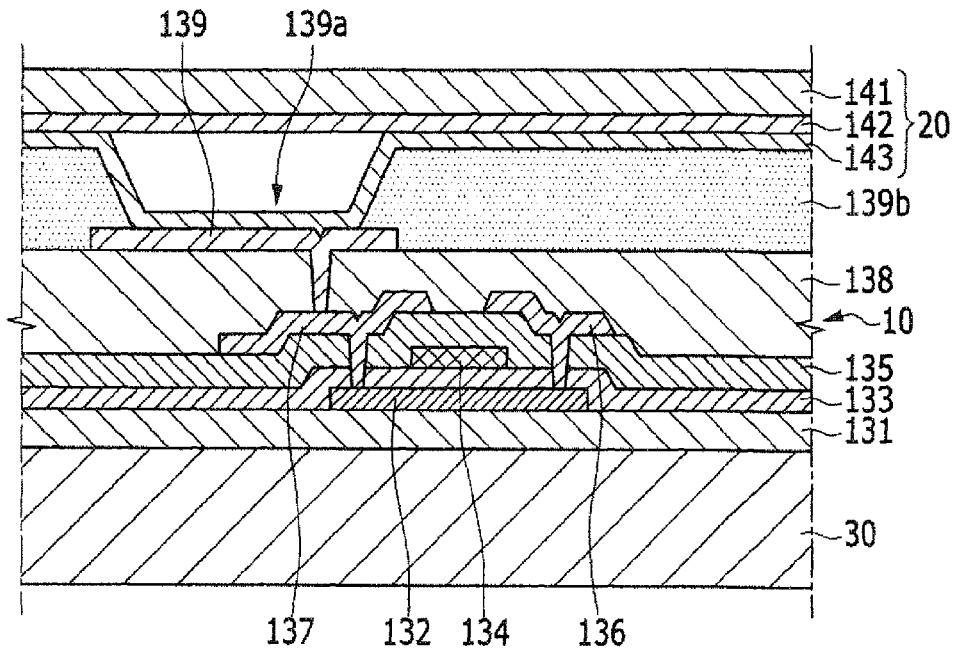
FIG. 5 is a cross-sectional view illustrating an acceptor substrate having an organic layer of a donor film transferred using a transport apparatus of FIG. 4.

FIG. 5 is a cross-sectional view illustrating an acceptor substrate having an organic layer of a donor film transferred using the transport apparatus of FIG. 4.

As shown in FIG. 5, the organic layer 143 may be transferred to the acceptor substrate 10 in correspondence to an opening 139a of the acceptor substrate 10.

Figure 6:
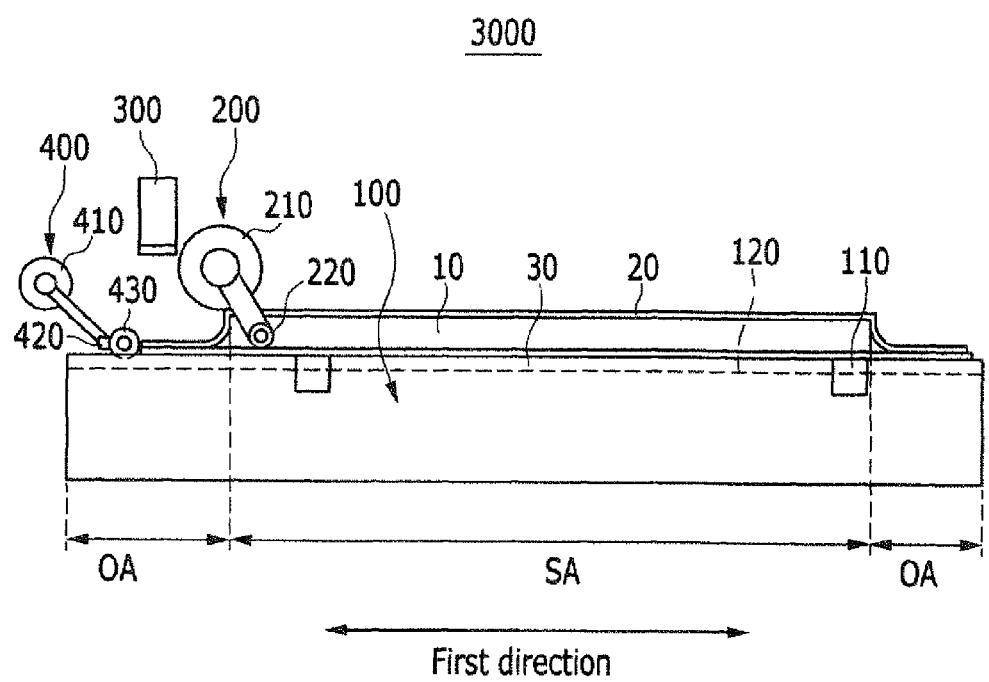
FIG. 6 to FIG. 8 illustrate a delamination apparatus of FIG. 1.
Figure 7:
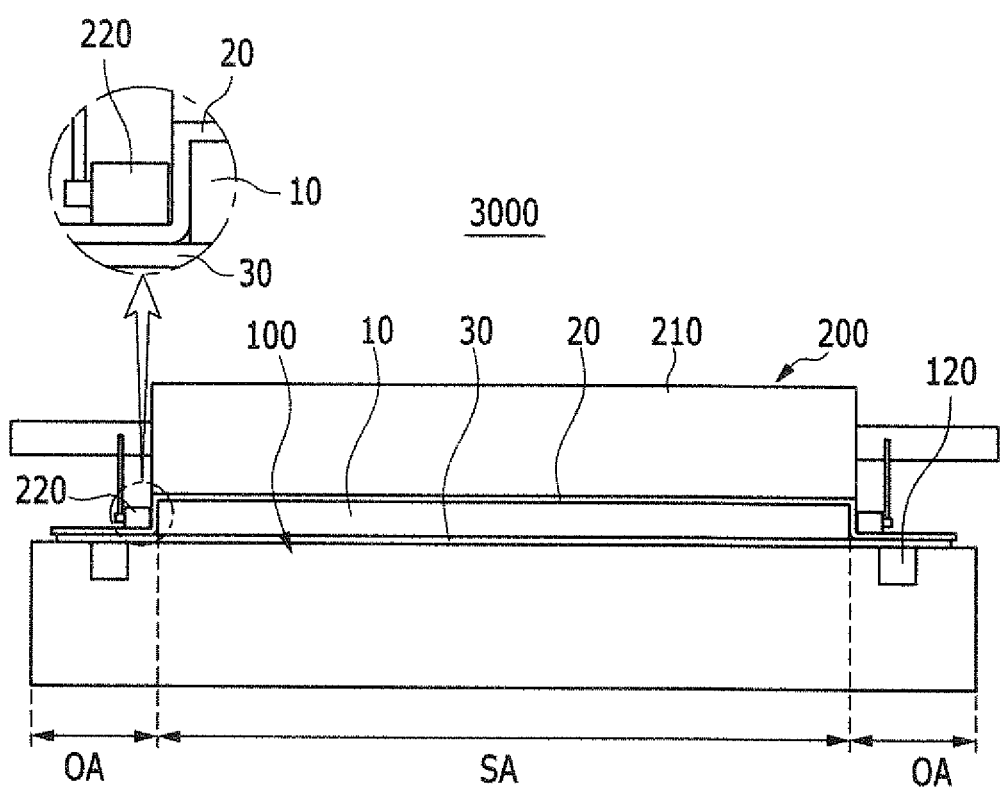
Figure 8:
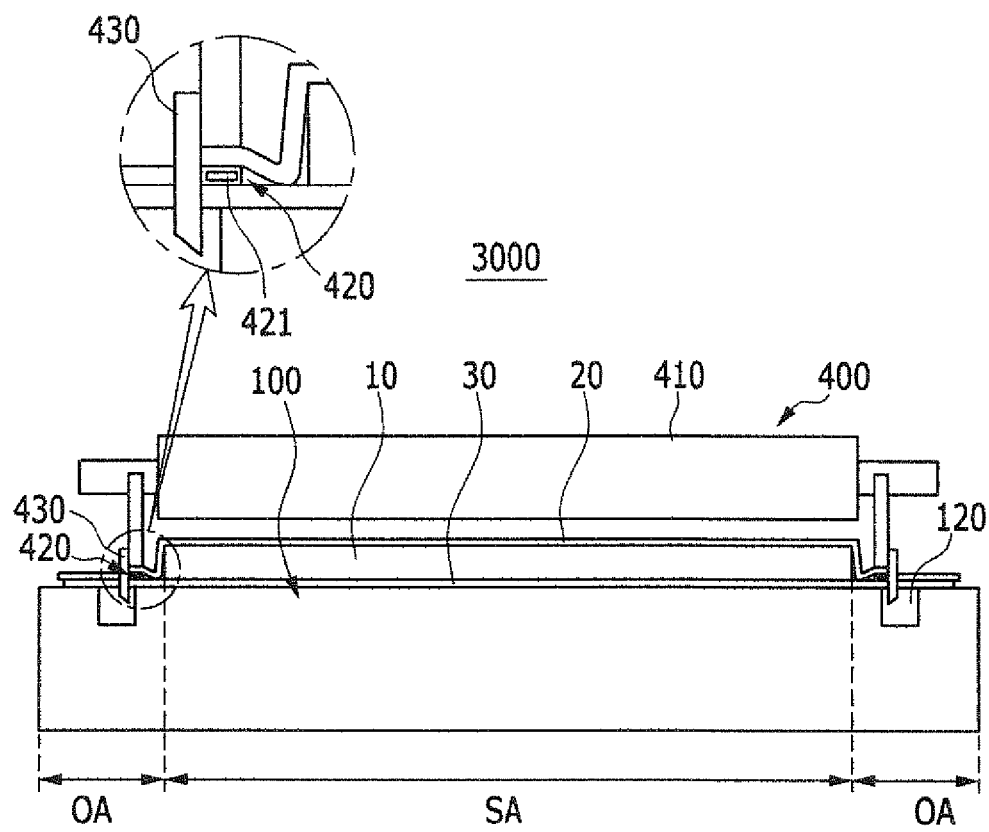

FIG. 6 to FIG. 8 illustrate a delamination apparatus of FIG. 1.

As shown in FIG. 1, the delamination apparatus 3000 may be adjacent to the transport apparatus 2000. The delamination apparatus 3000 of FIG. 6 may delaminate the donor film 20 from the acceptor substrate 10 to which the organic layer 143 is transferred. The delamination apparatus 300 may include a stage 100, a first roll unit 200, a gripper 300, and a second roll unit 400.

FIG. 7 is a front view illustrating a first roll unit.

As shown in FIG. 6 and FIG. 7, the first roll unit 200 may be disposed on the donor film 20 in correspondence to the substrate area (SA) and may be movable in a first direction. The first direction may be a lengthwise direction of the acceptor substrate 10. The first roll unit 200 may include a main roll 210 and a pressurizing roll 220.

The main roll 210 may be disposed on the donor film 20 in correspondence to a substrate area (SA). The main roll 210 may contact the donor film 20 when one edge of the donor film 20 is separated from the stage 100 by the gripper 300.

The pressurizing roll 220 may extend from the main roll 210 to the stage 100. The pressurizing roll 220 may pressurize the other edge of the donor film 20 corresponding to the peripheral area (OA). The pressurizing roll 220 may be adjacent to one end of the acceptor substrate 10 and may be disposed between the concavity unit 120 of the stage 100 and the one end of the acceptor substrate 10. The pressurizing roll 220 may pressurize the other edge of the donor film 20 corresponding to the peripheral area (OA).

The pressurizing roll 220 and the main roll 210 may be movable in the first direction.

The gripper 300 may be disposed on the donor film 20 in correspondence to a peripheral area (OA). The gripper 300 may grip one edge of the donor film 20 and move the donor film 20 to an upper side. Accordingly, the gripper 300 may separate the one edge of the donor film 20 from the stage 100. When the gripper 300 separates the one edge of the donor film 20 from the stage 100, the donor film 20 may contact the main roll 210 of the first roll unit 200.

FIG. 8 is a front view of a second roll unit.

As shown in FIG. 6 and FIG. 8, the second roll unit 400 may be adjacent to the first roll unit 200 and disposed on the stage 100. The second roll unit 400 may be movable in a first direction. The first direction may be a lengthwise direction of the acceptor substrate 10. The second roll unit 400 may move in the first direction when one edge of the donor film 20 becomes separated from the stage 100 by the gripper 300 and contacts the first roll unit 200. That is, the second roll unit 400 may become adjacent to the first roll unit 200 with the donor film 20 interleaved, and may contact the donor film 20. The second roll unit 400 may move in the first direction with the first roll unit 200 and delaminate the donor film 20 from the acceptor substrate 10. The second roll unit 400 may include a supplemental roll 410, a peeling tip 420, and a cutter 430.

The supplemental roll 410 may be adjacent to the main roll 210 and disposed on the donor film 20. The supplemental roll 410 may become adjacent to the main roll 210 with the donor film 20 interleaved, and may contact the donor film 20 when the donor film 20 becomes separated from the acceptor substrate 10 by the gripper 300 and contacts the main roll 210.

The peeling tip 420 may extend in a direction from the supplemental roll 410 to the state 100, and may be inserted between the donor film 20 corresponding to a peripheral area (OA) and the stage 100. The peeling tip 420 may correspond to the pressurizing roll 220, and may be disposed so as to be adjacent to one end of the acceptor substrate 10. The peeling tip 420 may be disposed between the concavity unit 120 of the stage 100 and one end of the acceptor substrate 10, and may be inserted between the donor film 20 corresponding to a peripheral area (OA) and a bottom film 30. The peeling tip 420 may include an inhaling member 421 for inhaling air between the donor film 20 and the stage 100. The peeling tip 420 may inhale air between the donor film 20 and the bottom film 20 through the inhaling member 421 when the peeling tip 420 is inserted between the donor film 20 and the bottom film 30. The inhaling member 421 may be coupled to an air inhaling device, such as a pump, for inhaling air.

The cutter 430 may be disposed at an outer side of the peeling tip 420 and may cut the donor film 20 corresponding to a peripheral area (OA). A part of the cutter 430 may be inserted in the concavity unit 120 of the stage 100 and cut the donor film 20 corresponding to the peripheral area (OA) along the first direction while moving in the first direction.

Hereinafter, a delamination process will described with reference to FIG. 9 to FIG. 13.

FIG. 9 to FIG. 13 illustrate a delamination process using a delamination apparatus of FIG. 6 to FIG. 8.

Figure 9:
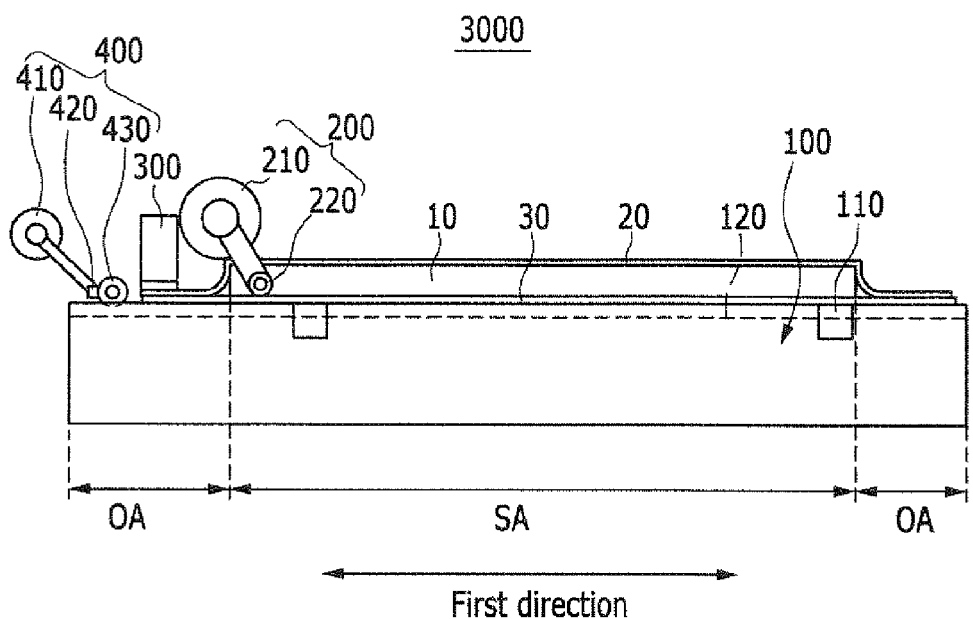
FIG. 9 to FIG. 13 illustrate a delamination process using a delamination apparatus of FIG. 6 to FIG. 8.

As shown in FIG. 9, one edge of the donor film 20, disposed at the peripheral area (OA) of the stage 100, may be gripped using the gripper 300. The first roll unit 200 may be disposed on the donor film 20 in correspondence to the substrate area (SA) of the stage 100, and the second roll unit 400 may be disposed adjacent to the first roll 200 with the gripper 300 interposed in correspondence to the peripheral area (OA) of the stage 100.

Figure 10:
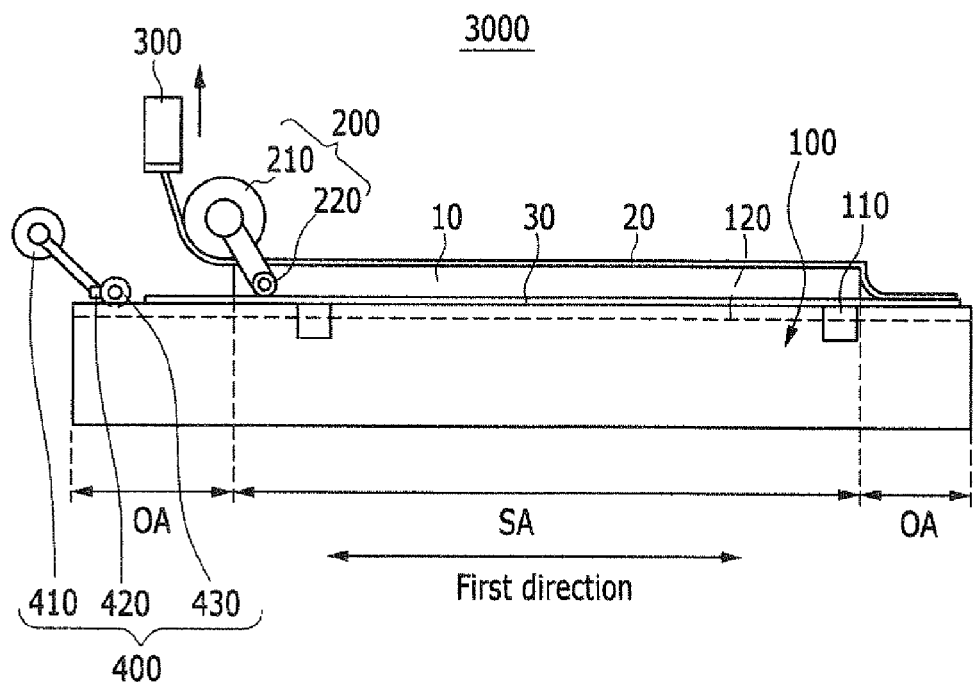

As shown in FIG. 10, the one edge of the donor film 200, disposed at the peripheral area (OA) of the stage 100, may be separated from the stage 100 by moving the gripper 300 upward. The donor film 20 may contact the main roll 210 of the first roll unit 200. Accordingly, the edge of the donor film 20 may become separated from the bottom film 30.

Figure 11:
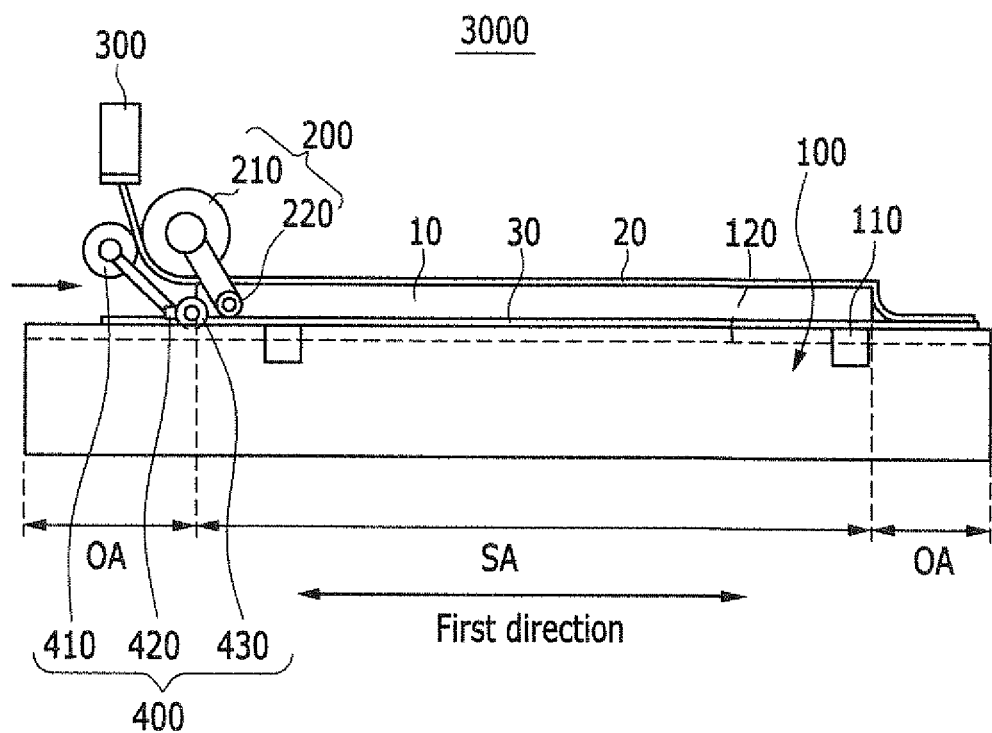
Figure 12:
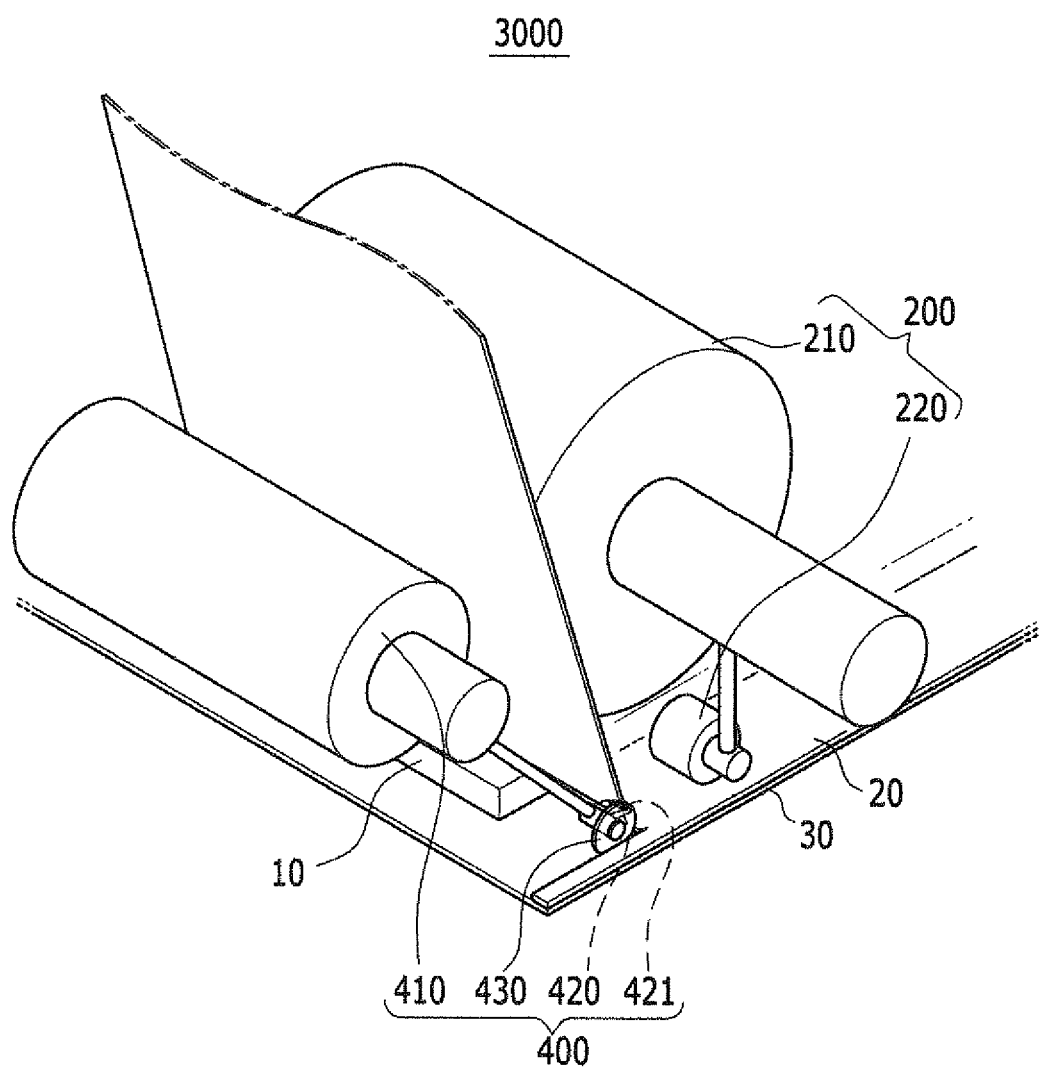

Then, the second roll unit 400 may be moved in the first direction which is a lengthwise direction of the acceptor substrate 10 as shown in FIG. 11 and FIG. 12. Accordingly, the second roll unit 400 may contact the donor film 20. As a result, the main roll 210 of the first roll unit 200 may become adjacent to the supplemental roll 410 of the second roll unit 400 with the donor film 20 interposed therebetween, and may contact the donor film 20. The cutter 430 of the second roll unit 400 may cut the other edge of the donor film 20 disposed at the peripheral area (OA) of the stage 100, and simultaneously the peeling tip 420 of the second roll unit 400 may be inserted between the donor film 20 and the bottom film 30 in correspondence to the donor film 20 pressurized by the pressurizing roll 220 of the first roll unit 200. At this point, the inhaling member 421 of the peeling tip 421 of the second roll unit 400 may inhale air between the bottom film 30 and the donor film 20.

Figure 13:
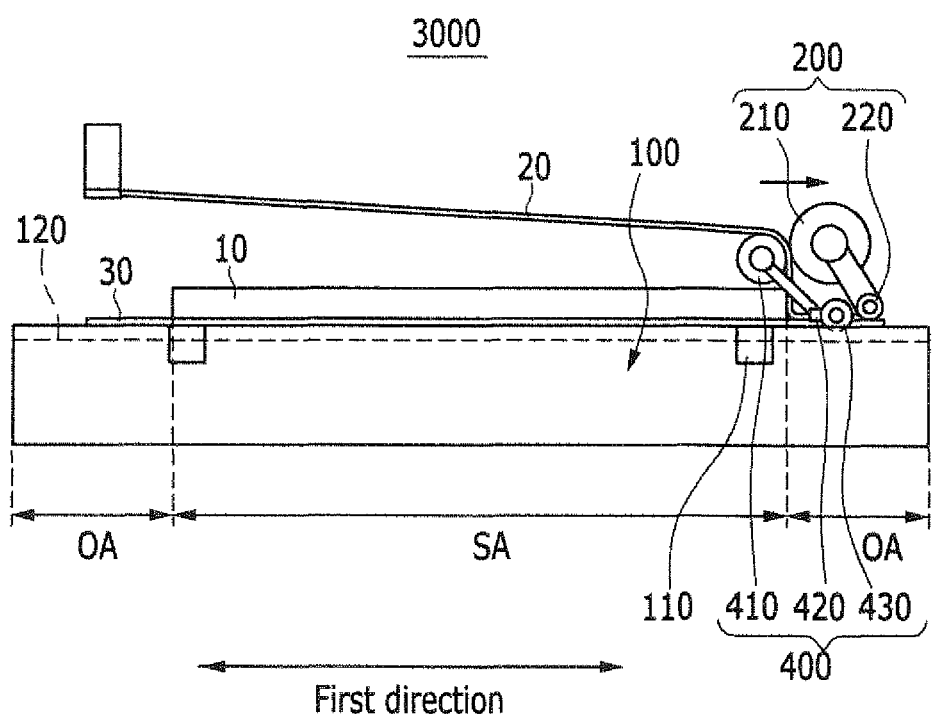

Thereafter, the first roll unit 200 and the second roll unit 400 may be moved together in the first direction, as shown in FIG. 13. Accordingly, the donor film 20 may be delaminated from the acceptor substrate 10.

As described above, the mail roll 210 of the first roll unit 200 and the supplemental roll 410 of the second roll unit 400 contact the donor film 20 and move in the first direction which is the lengthwise direction of the acceptor substrate 10. As a result, the donor film 20 may be delaminated from the acceptor substrate 10. Therefore, it may fundamentally prevent a defect that may be generated when the main roll 210 and the supplemental roll 410 contact the acceptor substrate 10.

Furthermore, the cutter 430 of the second roll unit 400 may cut the other edge of the donor film 20 disposed at the peripheral area (OA) of the stage 100. Simultaneously, the peeling tip 420 of the second roll unit 400 may be inserted between the donor film 20 and the bottom film 30 in correspondence to the donor film 20 pressurized by the pressurizing roll 220 of the first roll unit 200. Accordingly, it may prevent the donor film 20 from being separated from the bottom film 30 before cutting the other edge of the donor film 20 by the cutter 430, and it may also prevent outside air from penetrating between the donor film 20 disposed at the substrate area (SA) and the acceptor substrate 10 before the donor film 20 is delaminated from the acceptor substrate 10. Therefore, it may prevent the organic layer 143 from being reverse-transferred to the donor film 20 because outside air is prevented from penetrating between the donor film 20 and the acceptor substrate 10.

As described above, the inhaling member 421 of the peeling tip 420 of the second roll unit 400 may inhale air between the bottom film 30 and the donor film 20 while the peeling tip 420 of the second roll unit 400 is being inserted between the donor film 20 and the bottom film 30. Accordingly, the inhaling member 421 may inhale particles generated while the donor film 20 is separated from the bottom file 30 as well as the outside air. As a result, it may prevent the particles and the outside air from penetrating between the acceptor substrate 10 and the donor film 20.

Hereinafter, the acceptor substrate 10 after the donor film 20 is delaminated will be described.

Figure 14:
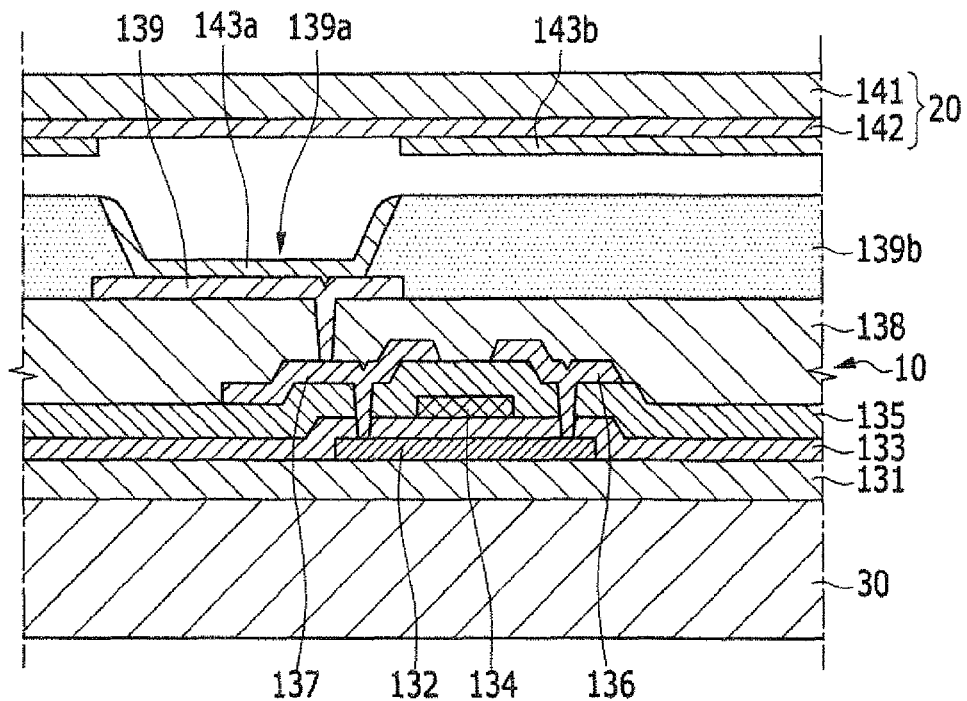
FIG. 14 is a cross-sectional view of an acceptor substrate after a donor film is delaminated by the delamination process of FIG. 9 to FIG. 13.

FIG. 14 is a cross-sectional view of an acceptor substrate after a donor film is delaminated by the delamination process of FIG. 9 to FIG. 13.

As shown in FIG. 14, as the donor film 20 is delaminated from the acceptor substrate 10, the organic layer 143a transferred in correspondence to the opening 139a of the acceptor substrate 10 may be separated from the organic layer 143b remaining at the donor film 20. The organic layer 143a, transferred in correspondence to the opening 139a of the acceptor substrate 10, may function as a light emitting mean of an organic light emitting element.

As described above, the inline thermal imaging system according to the first exemplary embodiment may include the lamination apparatus 1000, the transport apparatus 2000, and the delamination apparatus 3000, which share the stage 100. The inline thermal imaging system according to the first exemplary embodiment may perform the lamination process, the imaging process, and the delamination process in an inline manner.

Furthermore, the inline thermal imaging system according to the first exemplary embodiment performs the lamination process, the imaging process, and the delamination process using one stage 100. The lamination process, the imaging process, and the delamination process can be performed without the bottom film 30 by directly attaching the donor film 20 at the stage 100 so as to seal the acceptor substrate 10. Accordingly, manufacturing time and manufacturing cost can be reduced.

Hereinafter, a delamination apparatus according to a second exemplary embodiment of the invention will be described with reference to FIG. 15.

As compared to the delamination apparatus according to the first embodiment, only distinguishing elements of the delamination apparatus according to the second embodiment will be described. Since the remaining elements of the delamination apparatus according to the second embodiment have a similar configuration, a detailed description thereof will be omitted herein.

Figure 15:
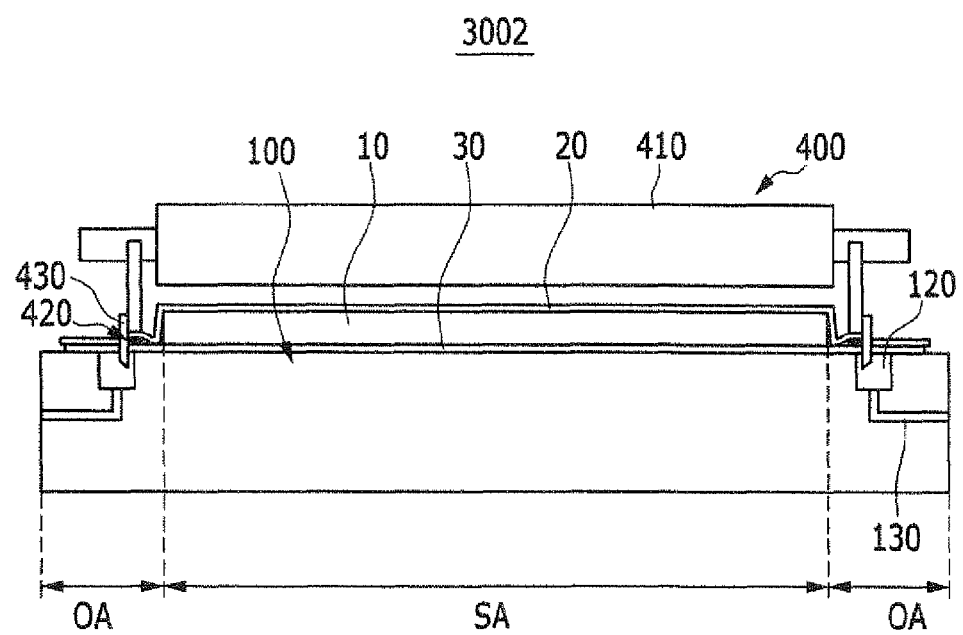
FIG. 15 illustrates a delamination apparatus in accordance with a second exemplary embodiment of the invention.

For better comprehension and ease of description, identical constituent elements between the first embodiment and the second embodiment will be described using the same reference numerals FIG. 15 illustrates a delamination apparatus in accordance with a second exemplary embodiment of the invention. Specifically, FIG. 15 is a front view of a second roll unit.

As shown in FIG. 15, a stage 100 of the delamination apparatus 3002 according to the second exemplary embodiment may further include an exhaling unit 130.

The exhaling unit 130 may be connected to the concavity unit 120, and may inhale air from the concavity unit 120. The exhaling unit 130 may be coupled to an air inhaling device, such as a pump, for inhaling air.

As described above, the delamination apparatus 3002 according to the second exemplary embodiment of the invention may inhale air from the concavity unit 120 using the exhaling unit 130 while the peeling tip 420 is inserted between the donor film 20 and the bottom film 30, and the donor film 20 is cut by the cutter 430. Accordingly, the exhaling unit 130 of the delamination apparatus 3002 may inhale first particles generated when the donor film 20 is separated from the bottom film 30, and second particles generated when the donor film 20 is cut by the cutter 430, as well as the outside air. Therefore, the delamination apparatus 3002 according to the second exemplary embodiment may prevent the first particles, the second particles, and the outside air from penetrating between the acceptor substrate 10 and the donor film 20.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A delamination apparatus, comprising:
   a stage including a substrate area and a peripheral area which is an area of the stage other than the substrate area, wherein an acceptor substrate laminated at a center part of a donor film, the center part covering the laminated substrate, the substrate being located in the substrate area, and an edge of the donor film is attached at the peripheral area;
   a first roll unit in direct contact with the donor film in the substrate area and configured to move in a direction parallel to the top surface of acceptor substrate;
   a gripper in direct contact with the donor film in the peripheral area and configured to separate an edge of the donor film from the stage so as to cause the donor film to contact the first roll unit; and
   a second roll unit in direct contact with the substrate and the second roll unit indirectly contacting the first roll unit when the donor film having a width approximately the same as that of one of the first roll unit and the second roll unit is sandwiched between and in direct contact with both the second roll unit and the first roll unit, said second roll unit being configured to delaminate the donor film from the acceptor substrate by moving with the first roll unit in said direction.

2. The delamination apparatus of claim 1, the acceptor substrate includes an align key, and the stage further includes a backlight unit positioned with the align key.

3. The delamination apparatus of claim 1, the first roll unit includes a main roll directly contacting the donor film in the substrate area; and
   a pressurizing roll extending in a direction from the main roll to the stage, and configured to pressurize the donor film in the peripheral area.

4. The delamination apparatus of claim 3, the second roll unit includes:
   a supplemental roll contacting the main roll through the donor film:
   a peeling tip extending in a direction from the supplemental roll to the stage reaching the horizontal level of the pressurizing roll and being inserted between the donor film in the peripheral area and the stage; and
   a cutter disposed at a side of the peeling tip opposite to the side directly facing the substrate and configured to cut the donor film.

5. The delamination apparatus of claim 4, the peeling tip includes an inhaling member configured to inhale air between the donor film and the stage.

6. The delamination apparatus of claim 4, the stage further includes a concave portion in the peripheral area, the concave portion being positioned with the cutter, and a part of the cutter is inserted into the concave portion.

7. The delamination apparatus of claim 6, the stage further includes an exhaling member connected to the concave portion and configured to inhale air of the concave portion.

8. The delamination apparatus of claim 1, a bottom film is disposed between the stage and the acceptor substrate and between the stage and the donor film in the peripheral area and the substrate area.

9. An inline thermal imaging system, comprising the delamination apparatus of claim 1, said inline thermal imaging system further comprising:
   a transport apparatus positioned within a conveying distance from the delamination apparatus, including a laser unit for radiating laser onto the donor film in the substrate area of the stage;
   a lamination apparatus positioned within a conveying distance from the transport apparatus, including a lamination unit for laminating the donor film to the acceptor substrate on the stage; and
   a stage conveying apparatus for conveying the stage sequentially to the lamination apparatus, the transport apparatus, and the delamination apparatus.

* * * * *